United States Patent
Nanis

(10) Patent No.: US 7,314,650 B1
(45) Date of Patent: Jan. 1, 2008

(54) METHOD FOR FABRICATING SPUTTER TARGETS

(76) Inventor: Leonard Nanis, 2114 Rosswood, San Jose, CA (US) 95124

( * ) Notice: Subject to any disclaimer, the term of this patent is extended or adjusted under 35 U.S.C. 154(b) by 98 days.

(21) Appl. No.: 10/896,305

(22) Filed: Jul. 21, 2004

Related U.S. Application Data

(60) Provisional application No. 60/492,768, filed on Aug. 5, 2003.

(51) Int. Cl.
*B05D 1/18* (2006.01)
*C23C 14/00* (2006.01)

(52) U.S. Cl. .................. 427/438; 427/443.1; 427/437; 204/192.1

(58) Field of Classification Search ..................... None
See application file for complete search history.

(56) References Cited

U.S. PATENT DOCUMENTS

| | | | |
|---|---|---|---|
| 3,562,000 A | 2/1971 | Parker | |
| 3,798,056 A * | 3/1974 | Okinaka et al. | 427/437 |
| 4,149,132 A * | 4/1979 | Richter et al. | 335/262 |
| 4,786,564 A * | 11/1988 | Chen et al. | 428/831 |
| 5,405,646 A | 4/1995 | Nanis | |
| 6,156,390 A | 12/2000 | Henry et al. | |
| 6,306,466 B1 | 10/2001 | Feldstein et al. | |
| 6,309,583 B1 | 10/2001 | Feldstein | |
| 6,328,927 B1 | 12/2001 | Lo et al. | |
| 6,342,114 B1 | 1/2002 | Lam et al. | |
| 6,423,196 B1 | 7/2002 | Ivanvov | |
| 6,506,509 B1 | 1/2003 | Feldstein et al. | |
| 6,586,047 B2 | 7/2003 | Durkin et al. | |
| 6,589,311 B1 | 7/2003 | Han et al. | |
| 6,627,118 B2 | 9/2003 | Kageyama et al. | |
| 6,630,203 B2 | 10/2003 | Bahn et al. | |
| 6,676,728 B2 | 1/2004 | Han et al. | |
| 6,706,420 B1 | 3/2004 | Kozlov et al. | |
| 6,709,557 B1 | 3/2004 | Kailasam et al. | |
| 6,713,391 B2 | 3/2004 | Yi et al. | |

OTHER PUBLICATIONS

Electroless nickel plating. http://en.wikipedia.org/wiki/Electroless_nickel_plating.*
Chapman, B. "Glow Discharge Processes," John Wiley and Sons, NY 1980, ISBN 0-471-07828-X, Chapter 6, pp. 177-194.
Gawrilov, G.G., "Chemical (Electroless) Nickel-Plating," Portcullis Press, England, ISBN 0-86108023-8, 1979, pp. 26-31, 165-167 and 169-175.
Mallory, Glenn O., et al., "Electroless Plating: Fundamentals and Applications," American Electroplaters and Surface Finishers Society, 1990, ISBN 0-936569-07-7, pp. 261-268 (Chapter 10).

(Continued)

*Primary Examiner*—Timothy Meeks
*Assistant Examiner*—David Turocy
(74) *Attorney, Agent, or Firm*—Haynes Beffel & Wolfeld LLP

(57) ABSTRACT

Sputter targets comprising a target backing plate and a target deposit, are manufactured using electroless and electrolytic deposition of metal and metal alloys on a surface of the target backing plate. Portions of the target backing plate other than the surface can be protected from the deposition process. In addition, sputter targets comprising a target backing plate and a target deposit with complex combinations of materials are manufactured by simultaneous electroless deposition of a matrix metal and particulate material.

36 Claims, 4 Drawing Sheets

OTHER PUBLICATIONS

Budniok, A., et al., "Advanced Materials Forum I," ISBN 0-87849-905-9, Proceedings 1st International Materials Symposium, Portugal, Trans Tech Publications Inc., Zurich, 3 pages.

Graham, Kenneth A., "Electroplating Engineering Handbook," ed. Van Nostrand Reinhold, NY, 1962, LC76-129204, Chapter 6, pp. 231-257.

* cited by examiner

FIG 3

PREPARATION OF BONDED SPUTTER TARGET

```
┌─────────────────────────────────────────────┐
│ MACHINE DELRIN POLYMER RECESSED             │
│ HOLDING FIXTURE                             │
└─────────────────────────────────────────────┘
                      │
┌─────────────────────────────────────────────┐
│ FIT TARGET STARTING SHEET INTO FIXTURE      │
└─────────────────────────────────────────────┘
                      │
┌─────────────────────────────────────────────┐
│ ATTACH SET SCREW CURRENT CONNECTORS         │
│ AND CURRENT WIRING FOR ELECTROPLATING       │
│ NUCLEATING LAYER                            │
└─────────────────────────────────────────────┘
                      │
┌─────────────────────────────────────────────┐
│ CLEAN STARTING SHEET SURFACE                │
│ ( SEE TABLE 1)                              │
└─────────────────────────────────────────────┘
                      │
┌─────────────────────────────────────────────┐
│ PLACE ASSEMBLY IN NICKEL SULFAMATE          │
│ PLATING BATH AND ELECTROPLATE THIN          │
│ NUCLEATING LAYER OF PURE NICKEL             │
│ (200 ANGSTROM)                              │
└─────────────────────────────────────────────┘
                      │
┌─────────────────────────────────────────────┐
│ RINSE IN DEIONIZED WATER                    │
└─────────────────────────────────────────────┘
                      │
┌─────────────────────────────────────────────┐
│ PLACE ASSEMBLY IN ELECTROLESS               │
│ NICKEL PLATING SOLUTION                     │
└─────────────────────────────────────────────┘
                      │
┌─────────────────────────────────────────────┐
│ REMOVE ASSEMBLY FROM ELECTROLESS NICKEL     │
│ PLATING AFTER DESIRED THICKNESS OF          │
│ NICKEL-PHOSPHOROUS ALLOY IS DEPOSITED,      │
│ RINSE, DRY                                  │
└─────────────────────────────────────────────┘
                      │
┌─────────────────────────────────────────────┐
│ DETACH ELECTROLESS PLATED                   │
│ STARTING SHEET FROM DELRIN FIXTURE          │
└─────────────────────────────────────────────┘
                      │
┌─────────────────────────────────────────────┐
│ SOLDER BOND UNPLATED SURFACE OF             │
│ STARTING SHEET TO BACKING PLATE             │
└─────────────────────────────────────────────┘
                      │
┌─────────────────────────────────────────────┐
│ INSTALL BACKING PLATE IN SPUTTERING CHAMBER,│
│ READY FOR SPUTTERING NICKEL-PHOSPHOROUS     │
└─────────────────────────────────────────────┘
```

FIG 4

PREPARATION FOR PLATING DIRECTLY ON
SPUTTER BACKING PLATE

| ATTACH CONDUCTING WIRE HOLDING FIXTURE TO REAR OF BACKING PLATE |
| --- |
| COAT ALL SURFACES WITH MASKANT EXCEPT FRONT OF BACKING PLATE |
| CLEAN FRONT SURFACE (SEE TABLE 1) |
| PLACE BACKING PLATE IN NICKEL SULFAMATE PLATING BATH AND ELECTROPLATE THIN NUCLEATING LAYER OF PURE NICKEL (200 ANGSTROM) |
| RINSE IN DEIONIZED WATER |
| PLACE BACKING PLATE IN ELECTROLESS NICKEL PLATING SOLUTION |
| REMOVE BACKING PLATE FROM ELECTROLESS NICKEL PLATING AFTER DESIRED THICKNESS OF NICKEL-PHOSPHOROUS ALLOY IS DEPOSITED, RINSE, DRY |
| MECHANICALLY TRIM EXCESS NICKEL-PHOSPHOROUS DEPOSIT AT OUTER EDGE OF BACKING PLATE |
| INSTALL BACKING PLATE IN SPUTTERING CHAMBER, READY FOR SPUTTERING NICKEL-PHOSPHOROUS |

METHOD FOR FABRICATING SPUTTER TARGETS

CROSS REFERENCE TO RELATED APPLICATIONS

This application is an application filed under 35 USC-111 (a) claiming benefit pursuant to 35USC-119(c)(1) of the filing date of Provisional Application 60/492,768; filed 5 Aug. 2003, pursuant to 35 USC-111(b).

BACKGROUND OF THE INVENTION

1. Field of the Invention

The present invention relates to an electroless plating method for the fabrication of targets for vacuum sputtering of nickel-phosphorous alloys and other materials.

2. Description of Related Art

Sputtering (also known as vacuum sputtering or physical vapor deposition) is uniquely suited for controlled and reproducible deposition of thin films on an atom layer-by-atom layer basis. Sputtering is the preferred method for adding the essential magnetic layer to memory disks used in computer disk drives. Sputtering is used in the fabrication of heads which write and read magnetic memories and is also used extensively in semiconductor chip fabrication. In addition to depositing thin layers of metals, sputtering is also a means for adding thin layers of insulating materials such as glass and aluminum oxide.

Details of the mechanism of sputtering may be found in texts on plasma physics such as "Glow Discharge Processes" by B. Chapman (John Wiley and Sons, NY 1980, ISBN 0-471-07828-X, Chapter 6, pages 177-194). Basically, atoms are knocked loose from a source target when argon ions energetically collide with the source target. A small amount of inert argon gas added to a vacuum becomes ionized in an electrical field applied between two electrodes. Positively charged ionized argon ions are accelerated by the voltage towards the negative target electrode. When the speeding argon ions collide with the target, the energy of the collision knocks target atoms loose which are then free to move through the vacuum to build up layers on the opposite electrode surface.

The typical components of a sputtering system include a vacuum chamber, vacuum pumps, source targets, inert gas control, and high voltage power supply. Targets are designed to be readily removed and replaced when sufficient material is eroded away as sputtering proceeds. Target design includes provision for cooling and electrical isolation of high voltage in the vacuum chamber. Customarily, the source material is in the form of a thick layer, typically 6 mm, bonded to a reusable copper backing plate using low-melting indium or indium alloy solder.

Sputter targets of metals and metal alloys are conventionally fabricated by two major methods:
1) metal or metal alloy melting, casting, and subsequent shaping and machining;
2) powder metallurgical methods such as hot-pressing or sintering of pure metal powder or a mixture of powders of desired alloy components.

As recent examples of alloy melting, Lam et al. (U.S. Pat. No. 6,342,114) describe vacuum melting of nickel-vanadium sputter targets. Ivanvov (U.S. Pat. No. 6,423,196) describes casting ingots from a molten mixture of nickel and silicon whereas Yi et al. (U.S. Pat. No. 6,713,391) describe forming silicon-nickel (and other silicon alloy) targets by powder metallurgical methods.

Powder metallurgy methods require presses of substantial size coupled with dies that sustain high temperature heating and which may require simultaneous application of vacuum. Cycles for degassing of blended powder compacts, uniaxial compression, multiple stages of sintering and hot pressing followed by slow cooling of intermetallic compound targets are described by Yi et al. (U.S. Pat. No. 6,713,391). Lo et al. (U.S. Pat. No. 6,328,927) describe hot-isostatic pressing (H.I.P.) of tungsten powder to form a sputter target. Powders are generally required to be of closely controlled, finely divided particle sizes to facilitate sintering. Han et al. (U.S. Pat. No. 6,676,728 and U.S. Pat. No. 6,589,311) describe H.I.P. of plasma-sprayed powders of various high-melting metals to form sputter targets.

In a variant of method 1, alloys may also be sputtered from a target comprised of a mechanically assembled mosaic array of pure solid constituent metals inlaid in a matrix, as described by Kailasam et al. U.S. Pat. No. 6,709,557

The powder metallurgical techniques of hot pressing or hot isostatic pressing (H.I.P.) have been used for manufacturing nickel-phosphorous (Ni—P) targets. A major application of these Ni—P targets has been as a source for thin sputtered layers on glass substrates to provide an optically opaque layer to facilitate laser texturing of a head landing zone. A new application of sputtered Ni—P in the disk industry is for adding a seed layer (Nanis U.S. Pat. No. 5,405,646) to nucleate electroless nickel plating on high strength metal substrates which are alternatives to glass and conventionally used aluminum-magnesium alloys.

The starting material for nickel-phosphorous powder metallurgy may be obtained by aqueous chemical precipitation methods as described by Kageyama et al. (U.S. Pat. No. 6,627,118). Targets of Ni—P made in this manner are sintered so as to produce a narrow range of porosity. Porous targets are less desirable than solid targets since they require lengthy pump down times to remove entrained gases and to achieve good vacuum levels in the sputtering chamber. Also, porous target material does not conduct heat as well as solid metal targets, thereby limiting target power levels and thus sputtering rates.

Melting and casting methods are not presently used for making fully dense Ni—P targets because highly reactive elemental phosphorous is difficult to add directly to molten nickel. The disclosed technology describes nucleated electroless plating as a novel and simple method different from casting or powder methods for fabricating solid, 100 percent dense nickel-phosphorous and similar alloy sputter targets.

SUMMARY OF THE INVENTION

According to the technology described herein, sputter targets comprising a target backing plate and a target deposit, are manufactured using electroless and electrolytic deposition of metal and metal alloys on a surface of the target backing plate. In embodiments, portions of the target backing plate other than the surface are protected from the deposition process. In addition, sputter targets comprising a target backing plate and a target deposit are manufactured by simultaneous electroless deposition of a matrix metal and particulate material.

The technology described herein includes the formation of sputter targets for nickel-phosphorous metals using electroless deposition to form a nickel-phosphorous sputter target on a target backing plate.

Embodiments of the technology include forming a layer of nucleating material on the target backing plate, to nucleate electroless deposition of the target deposit. The layer of nucleating material is formed by electroless deposition, electrolytic deposition, sputtering, or sputtering in combination with formation of an underlayer of binder material.

The technology described herein enables a wide variety of target deposits, including in particular, alloys of nickel and phosphorous and nickel and boron including an alloy of nickel and phosphorous with chromium; an alloy of nickel and boron with chromium; an alloy of nickel and phosphorous with cobalt; an alloy of nickel and boron with cobalt; an alloy of nickel and phosphorous with iron; an alloy of nickel and boron with iron; an alloy of nickel and phosphorous with copper; an alloy of nickel and boron with copper; an alloy of nickel and phosphorous with molybdenum; an alloy of nickel and boron with molybdenum; an alloy of nickel and phosphorous with tungsten; an alloy of nickel and boron with tungsten; an alloy of nickel and phosphorous with rhenium; an alloy of nickel and boron with rhenium; an alloy of nickel and phosphorous with tin; an alloy of nickel and boron with tin; and an alloy of nickel and phosphorous and boron.

In other embodiments, the technology enables target deposits including platinum, rhodium, an alloy of cobalt and phosphorous, an alloy of cobalt and copper and phosphorous, an alloy of cobalt and rhenium and phosphorous, an alloy of cobalt and tungsten and phosphorous, an alloy of cobalt and molybdenum and phosphorous, an alloy of cobalt and boron, an alloy of cobalt and rhenium and boron, and an alloy of cobalt and thallium and boron.

In embodiments comprising simultaneous co-deposition of a matrix metal with particulate material, representative matrix metals include copper, alloys of nickel and phosphorous, alloys of nickel and boron, alloys of cobalt and phosphorous, alloys of cobalt and boron, and other alloys such as those outlined above in connection with the formation of target deposits without particulate material. Particulate materials in embodiments of the technology include finely divided materials having particle sizes in the range of 0.1 to 100 microns, and in some embodiments in the range of 0.1 to about 10 microns. Representative particulate materials include chromium, molybdenum, tungsten, boron, titanium, vanadium, zirconium, hafnium, niobium, tantalum, pre-alloyed mixtures of metals including mixtures comprising iron, chromium and nickel, mixtures comprising chromium and cobalt, and other materials comprising pre-alloyed powders. In some embodiments, the particulate material is a nonmetal, such as a nonmetal compound. In other embodiments, the particulate material comprises hard materials including diamond, silicon, silicon carbide, and aluminum oxide.

Other aspects and advantages of the technology described herein are provided with reference to the detailed description and claims which follow.

BRIEF DESCRIPTION OF THE DRAWINGS

FIG. 3. is a flow chart for preparation of bonded sputter target.

FIG. 4. is a flow chart for plating directly on sputter backing plate.

DESCRIPTION OF EMBODIMENTS

The disclosed technology is an alternative to the methods of casting and powder metallurgy for sputter target fabrication. For example, standard commercially available electroless nickel solutions used in the metal finishing and plating industry permit us to grow a thick deposit of Ni—P on a substrate chosen for its ability to nucleate the deposition of Ni—P. Once started, further growth of new Ni—P layers continues automatically by the "autocatalytic" nature of the electroless nickel reaction.

Electroless plating is a so-called "redox" chemical process made up of separate but balanced partial reactions which occur simultaneously at a surface. One reaction is the reduction of nickel ions in the plating bath to become a solid nickel metal deposit. A balancing reaction is provided by the oxidation of hypophosphite ions in the plating bath. The reactivity of the chemicals dissolved in the plating bath provides the driving force for the overall redox reaction so that no connection to an external voltage source is required.

Figure 1:
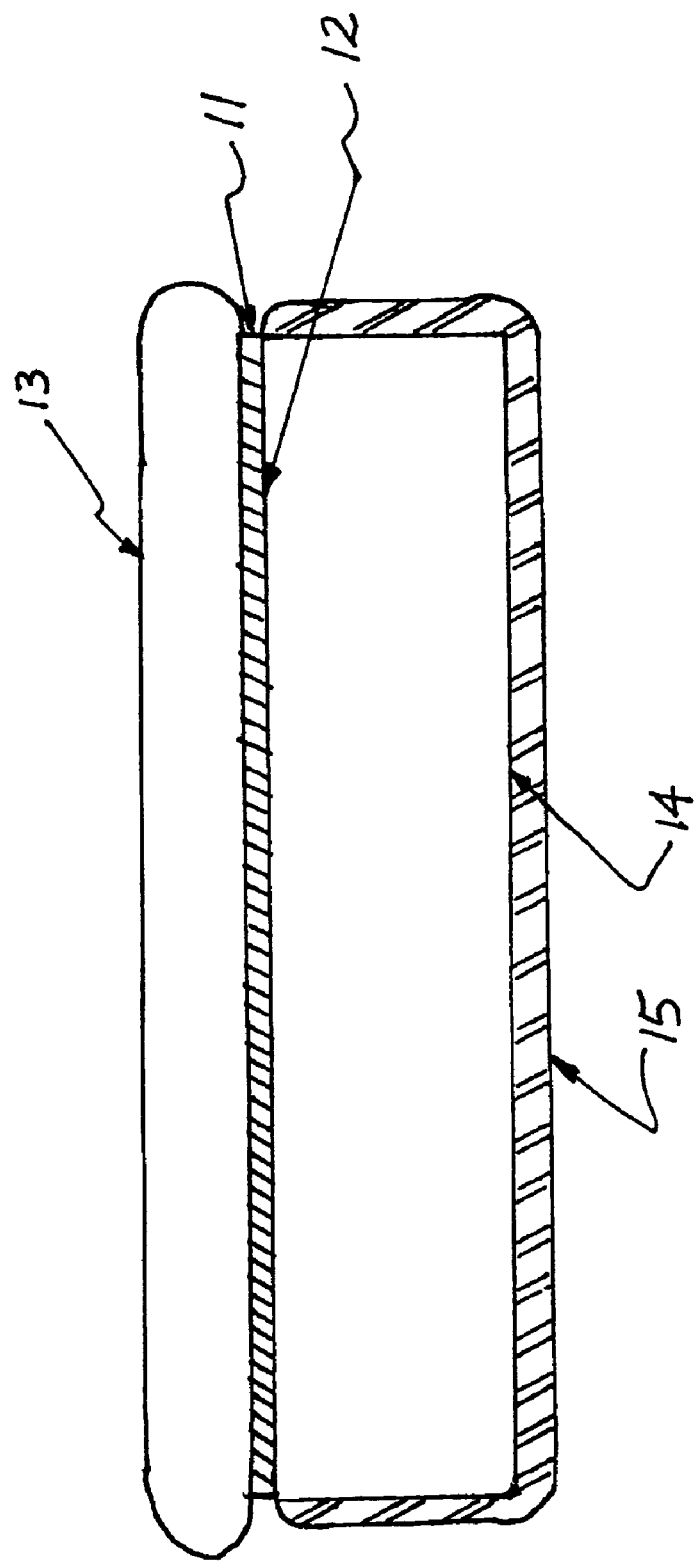
FIG. 1. is a schematic drawing of starting sheet, nucleating layer and electroless deposit for sputter target.
Figure 2:
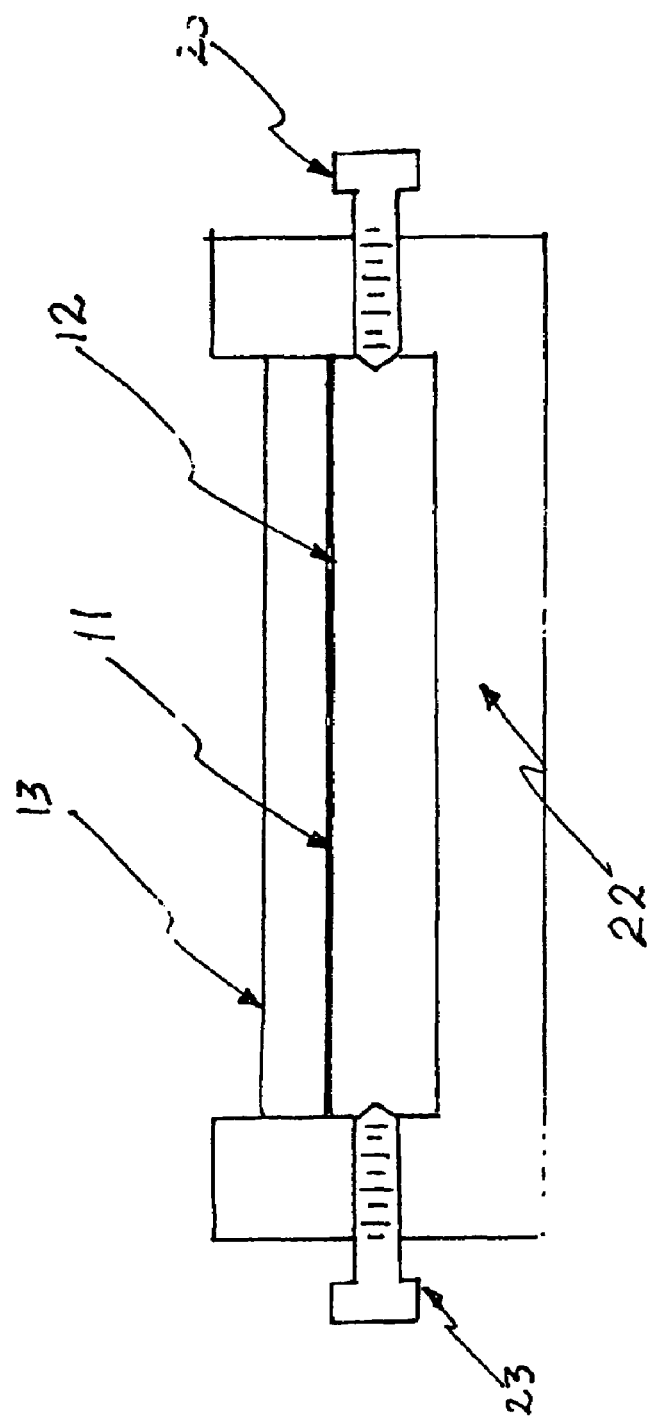
FIG. 2. is a schematic drawing of insulating polymer fixture for holding a starting sheet during deposition.

As shown in FIG. 1, a thin nucleating layer (11, not to scale) which triggers Ni—P deposition may be added onto a front surface of a starting sheet (12) by means of electrolytic deposition or by sputtering or by other means such as vacuum evaporation. Upon immersion of the starting sheet in an electroless nickel plating solution, the thin nucleating layer initiates the deposition of electroless nickel (13) which is then grown to a desired thickness. No Ni—P deposit is formed on the rear side (14) of the starting sheet which receives no nucleating layer and is also shielded from contact with the electroless plating solution by a non-conducting maskant layer (15, not to scale). Alternatively, as shown in FIG. 2, a starting sheet (12) may be secured in an insulating polymer fixture (22) by means of set screws (23) so that only the front face of the starting sheet is exposed to cleaning solutions, electrodeposition solution for adding the thin nucleating layer and, finally, the electroless plating solution. The set screws (23) serve as convenient current connections for electroplating the thin nucleating layer (11, FIG. 1) and also for attaching means (not shown) to suspend the assembly in the electroless plating tank.

The insulating polymer holding fixture (22, FIG. 2) is recessed to a depth greater than the thickness of the starting sheet (12) to provide room for the growing deposit. The walls of the recess serve to constrain the shape of the deposit to a flat disk geometry with minimal sideways growth.

Since plated Ni—P generally has low internal residual stresses, there is minimal distortion of the starting sheet. After a desired thickness of Ni—P has been grown, the maskant layer (15, FIG. 1) is peeled off and, if necessary, any excess plated material protruding at the outer edge may be removed by machining or grinding. For a starting sheet held during plating in a polymer fixture (22) as shown in FIG. 2, the plated sheet may be removed by loosening set screws (23). For either method, the unplated rear side of the starting sheet may then be readily bonded to a copper backing plate by conventional means using low-melting indium or indium alloys. A flow chart for preparation of a bonded target using a polymer holding fixture for plating is shown in FIG. 3.

Alternatively, Ni—P may be plated directly on a copper backing plate by adding a thin nucleating layer on the front face (vacuum side) of the backing plate with all other surfaces being masked to prevent unwanted Ni—P deposition. A flow chart for plating target material directly onto a backing plate is shown in FIG. 4.

Deposition of electroless nickel may be considered as a relatively slow process, suitable for adding layers on the order of 0.0005 inch (13 microns) in thickness over a time period of 1.5 hours, as in plating on aluminum memory disk substrates. However, there is no fundamental limit to the thickness which may be grown. To achieve a typical target layer thickness of 0.25 inch (6.35 mm) requires a few weeks of Ni—P deposition. However, once started, electroless plating proceeds conformally, following the surface finish of the starting surface. There is no thickness variation across the growing surface and no buildup near edges as found with the non-uniform distribution of current associated with electrolytic plating systems. Thus, no final machining is required to obtain a planar surface. Further, the electroless deposition requires minimal operator attention other than routine bath composition analysis and maintenance by chemical additions.

Ni—P plating may be interrupted at any time to remove the part and its deposit for inspection which may then be returned to the bath for additional plating. The rate can be increased by increasing bath temperature and/or pH. Ni—P plating rates of 24 microns per hour or greater can be obtained with proper bath control, as referenced in the text by Gawrilov ("Chemical Electroless Nickel Plating", Section 6.3, Portcullis Press, England, ISBN 0-86108023-8).

Ni—P plating at the rate of 24 microns per hour on a continuous 24 hour per day basis will yield a 0.25 inch (6.35 mm) deposit in 11 days. It is noted that powder metallurgy hot vacuum press methods are slow and can typically require total cycle times of eight hours, not including slow cooling time to prevent cracking of a brittle material, as described by Yi (U.S. Pat. No. 6,713,391). In comparison with the capital cost of a press and associated equipment for powder methods to form one target, the disclosed technology offers a trade-off where several Ni—P targets of different shapes can be simultaneously grown in a single relatively low cost 500 gallon plating tank.

An advantage of the disclosed technology is that solid alloy mixtures can be achieved by the simple method of pre-mixing constituent chemicals in an aqueous solution to form the electroless plating bath. A number of such alloys are known and can be used to produce multi-component sputtering targets.

Alloy mixtures include:
Nickel-cobalt-phosphorous
Nickel-iron-phosphorous
Nickel-chromium-phosphorous
Nickel-copper-phosphorous
Nickel-tungsten-phosphorous
Nickel-molybdenum-phosphorous
Nickel-rhenium-phosphorous
Nickel-tin-phosphorous Whereas the phosphorous containing deposits are produced essentially with hypophosphite ion as a reducing agent, the method of the disclosed technology is also directly applicable to form sputter targets by electroless deposition of boron alloys from solutions in which the reducing agent is a boron-containing compound such as sodium borohydride, dimethyl amino borane and the like. Typical boron-containing alloys are:

Nickel-boron
Nickel-cobalt-boron
Nickel-iron-boron
Nickel-tin-boron
Nickel-tungsten-boron
Nickel-molybdenum-boron
Nickel-rhenium-boron Nickel and cobalt are chemically similar and sputtering targets of alloys based on cobalt as the major constituent may also be formed by the methods of the disclosed technology. Some typical cobalt alloys are:

Cobalt-phosphorous
Cobalt-copper-phosphorous
Cobalt-rhenium-phosphorous
Cobalt-tungsten-phosphorous
Cobalt-molybdenum-phosphorous
Cobalt-boron
Cobalt-rhenium-boron
Cobalt-thallium-boron Gawrilov ("Chemical Electroless Nickel Plating", Chapter 17, Portcullis Press, England, ISBN 0-86108023-8) discusses the chemical mixtures and plating conditions for the said boron and phosphorous containing alloys. The chemistry of electroless deposition of alloys is also discussed by Pearlstein (Chapter 10, "Electroless Plating, Fundamentals And Applications, edited by G. Mallory and J. Hajdu, American Electroplaters and Surface Finishers Society, 1990, ISBN 0-936569-07-7).

Plating bath formulations for use in electroless deposition can be developed for depositing mixtures containing multiple alloy elements.

Target compositions may be formed which are otherwise difficult or costly to fabricate either by alloy melting or by powder metallurgy methods. As an example, the high melting point metals platinum (1773 degrees C.) and rhodium (1966 degrees C.) can be mixed to form alloys without melting. Platinum-rhodium alloys may be obtained by electroless plating from aqueous solution at temperatures below 100 degrees C., as taught by Kozlov et al. (U.S. Pat. No. 6,706,420). Kozlov describes hydrazine hydrate as the reducing agent for electroless deposition of platinum-rhodium alloys from ammine-nitrite salts of platinum and of rhodium dissolved in alkaline aqueous solutions operated at 60 degrees C.

Kozlov at al. (U.S. Pat. No. 6,706,420) indicate that nickel and chromium act as catalytic substrates for electroless deposition of platinum-rhodium alloy. For the purpose of the disclosed technology, a thin nucleating layer of nickel or chromium may be added to a copper backing plate by well-known aqueous electrodeposition methods or by sputtering or other suitable deposition methods. Alternatively, a thin rhodium nucleating layer may be added by electroplating from a commercially available plating solution, Rhodex SP (Enthone-OMI, New Haven, Conn.).

Yet another advantage of the disclosed technology is the ability to select the composition of the target by incorporating solid particulate materials in the Ni—P deposit. The co-deposition of finely divided solids added to the Ni—P bath is widely used to incorporate hard materials such as silicon carbide, diamond or aluminum oxide. Of interest for the disclosed technology, finely divided metals may also be incorporated in the growing deposit.

The solid particles are typically in the range 0.1 to 10 microns in diameter and are kept in suspension by stirring of the plating bath. As the Ni—P matrix grows, the particles become completely encapsulated within the growing metal deposit. Gawrilov ("Chemical Electroless Nickel Plating", Chapter 16, Portcullis Press, England, 1979, ISBN 0-86108023-8) reviews said dispersion co-deposits of carbides, diamond and oxides. Such composite mixtures may have application as sputtering targets. Conditions for co-deposition of said hard materials are described in detail by Henry et al, U.S. Pat. No. 6,156,390; Feldstein et al, U.S. Pat. No. 6,306,466; U.S. Pat. No. 6,506,509; Feldstein, U.S. Pat. No. 6,309,583; Bahn et al, U.S. Pat. No. 6,630,203; and Durkin et al, U.S. Pat. No. 6,586,047.

Gawrilov notes that the addition of finely-divided particles to an electroless plating bath is a seemingly contradictory procedure since such solutions are conventionally highly filtered to remove particles. It is thus important that the added particles do not themselves act as catalysts for the electroless process. Whereas most of the work on co-deposition has centered on the inclusion of hard particles, little effort has been given to the co-deposition of metal particles. However, in 1971, K. Parker reported in U.S. Pat. No. 3,562,000 that metal powders may be co-deposited in electroless nickel and also electroless cobalt and copper.

The co-deposition of metal powders added to the electroless bath affords wide opportunities for preparing sputter targets with compositions difficult to attain by casting molten metal or pressing and sintering compacted powders. In listing several powdered materials that can be incorporated in electroless nickel, Gawrilov cites metals reported by Parker in U.S. Pat. No. 3,562,000. These include powders singly and in combination comprised of:

Chromium
Molybdenum
Tungsten
Boron
Titanium
Vanadium
Zirconium
Hafnium
Niobium
Tantalum Parker (U.S. Pat. No. 3,562,000, example 15, col. 11 line 58) also reported on composites of electroless nickel which incorporated powders of commercial alloys, including Haynes stellite and also type 304 stainless steel (Col. 14, line 55).

The stellite alloy powders provided a pre-mixed source primarily of cobalt and chromium with a few percent each of other elements. For example, Haynes stellite no. 6 powder contained 28% chromium and 59% cobalt plus tungsten (4%), iron (3%), nickel (3%), manganese (1%), silicon (1%) and carbon (1%). The resulting plated composite comprised 85% nickel, 9% phosphorous and 6% of the stellite alloy.

The composite mixtures of said pure metals and alloys with electroless nickel taught by Parker were also extended to include electroless cobalt as the matrix metal. In addition, Parker teaches that electroless copper also serves as a matrix to contain said particles of metals and alloys. The main ingredients of the alkaline electroless copper bath (Col. 14, line 29-34) comprised copper sulfate with formaldehyde as reducing agent.

There is a multiplicity of combinations of matrix metal with codeposited particles of metals and alloys, all of which have potential useful application for forming sputtering targets by the method of the present invention. In general, the disclosed method readily permits sputter targets to be grown to less than full thickness, an advantage for rapid tailoring of alloy compositions for specific tasks such as selecting the magnetic properties of an underlayer for perpendicular recording.

The disclosed method of building a sputtering target may be adapted to conventional electrolytic plating of pure metals and alloys as well as for nucleated electroless plating. Achieving a typical target thickness of 6 mm may be a lengthy process requiring several days but can be fully automated to operate continuously for either electroless deposition or electrolytic deposition requiring the passage of current. Target alloys may also be prepared by the incorporation of powders suspended in an electroplating solution where the particulate material becomes encapsulated in the growing electrodeposit. An example is the co-deposition of titanium powder in a matrix of electrodeposited nickel-phosphorous alloy, reported by Budniok and Serek, Advanced Materials Forum I, page 213, 2002, ISBN 0-87849-905-9 (Proceedings 1st International Materials Symposium, Portugal, 2001. Trans Tech Publications Inc, Zurich).

It will be recognized that the composition of an alloy comprised of matrix deposit with co-deposited metal powder can be selected by adjusting the volume percentage of solids suspended in the liquid in a single plating bath. This flexibility in controlling alloy composition applies to both electroless and electrolytic plating baths and is a distinct advantage over melting and also pressed powder methods for forming sputter targets.

Since the driving force for electrodeposition is provided externally, the current density may be controlled for optimum deposition rate. In addition, electroplating solutions will not tend to initiate plating on suspended particles, as may occur when certain nucleating powdered metals contact electroless baths in which dissolved chemicals are poised for reaction. Also, a thin layer for nucleating electroless deposition on a copper backing plate may be unnecessary for an electroplated matrix metal.

There is a multiplicity of plating baths for various metals and alloys which can be the matrix for co-deposited metal powder particles to form sputtering targets. For example, the Watt's bath and the sulfamate bath are well known solutions for the electrodeposition of nickel. Many other plating bath formulations may be found in standard texts such as "Electroplating Engineering Handbook", A. K. Graham, Ed, Van Nostrand Reinhold, N.Y., 1962, LC76-129204, Chapter 6.

For electrolytic plating of pure metals or alloys, non-uniform distribution of current can be minimized with insulating fixtures which confine current to the front surface only of the growing target. A solid insulating fixture fitted at the outer edge of a target backing plate will confine deposition to a selected area to minimize lateral growth at the edge. Delrin (Dupont) is a typical polymer suitable as a fixture material, compatible with both electrolytic and electroless plating conditions. The polymer holding fixture shown in FIG. 2 is suitable for electrodeposition onto a starting sheet as well as for electroless plating.

In the practical operation of sputter targets, ideal 100 percent utilization of material is never achieved. Usually, sputter target wear is non-uniform, determined by the shape of the argon plasma electrical field. Targets are removed from service when the eroded wear track deepens, well before a copper backing plate becomes exposed. With the disclosed technology, to renew a worn target, fresh Ni—P may be added by returning the target to the Ni—P plating tank where Ni—P remaining on the target will serve to catalyze new deposition. A backing plate may thus be recycled repeatedly. Ni—P may be selectively added to the depleted wear zone by the use of staged masking so the deepest part of the wear track may be filled first, followed by an overall restoration of target thickness and planarization, if required. Greater total target utilization may also be obtained by initially plating extra material selectively in the zone of greatest expected wear.

When an Ni—P target is nearly consumed, the starting sheet may be debonded from the backing plate by melting the indium solder and residual Ni—P may then be stripped chemically or mechanically and the sheet then reactivated and replated to renew the Ni—P thickness. Maskant may be applied to surfaces where attack by chemical stripping solution is unwanted. Since etchants for Ni—P such as nitric acid may also attack a copper backing plate or starting sheet, it will be advantageous to electroplate a layer of gold on the copper before adding the thin pure nickel seed layer. The gold will help protect the underlying copper as the unused Ni—P is etched away. Alternatively, a sputtered underlayer of chromium may also serve to protect a copper starting sheet from attack when residual Ni—P is stripped chemically.

In addition to copper, aluminum backing plates may also be used to support a grown layer of electroless nickel. A sacrificial zinc nucleating layer may be added to aluminum or aluminum alloy by conventional zincate pretreatment. Alternatively, Ni—P deposition may be nucleated by a thin sputtered catalytic layer of Ni—P, preferably with a sputtered underlayer of chromium as in the example of aluminum alloy substrate described in the Preferred Embodiment of this invention. A layer of Ni—P added to an aluminum backing plate will also enable the subsequent electrodeposition or electroless deposition of other metals and composites. Maskant will protect areas where no deposition is required.

The front surface of a standard 8 inch diameter copper backing plate (SEGI part 60-190600-01) was coated with a thin nucleating layer of pure nickel. First, the entire surface of the base plate, except the front surface, was coated with two layers of plater's stop-off paint (Enplate Maskant No. 1, Enthone Corp.). A 200 Angstrom thick layer of pure nickel was electroplated from a conventional nickel sulfamate bath onto the uncoated front surface of the copper backing plate. The sequence of preparation steps is shown in Table 1.

TABLE 1

Copper Backing Plate Activation

1) Coat copper backing plate (except front face) with stop-off paint, (Enthone Enplate Maskant No. 1) air-dry 24 hours, add second coat, air-dry
2) Lightly scrub copper uncoated front surface with Scotchbrite abrasive pads
3) Rinse, deionized water
4) Wash in soap solution, NuClean No. 7 at 25 C.
5) Rinse, deionized water
6) Bright dip in sulfuric-nitric acid mixture, 8 seconds
7) Rinse, deionized water
8) Plate 200 Angstroms nickel on front face, 10 seconds at 16 mA per sq.cm., nickel sulfamate bath, 25 C.

The 200 Angstrom thick electroplated nickel layer catalyzed a steady deposition of Ni—P when the prepared backing plate was suspended in an electroless nickel plating bath (Fidelity Type 5023 high phosphorous) maintained at a temperature of 185 degrees Fahrenheit (85 degrees Celsius). The Ni—P plating rate was typically 230 microinches per hour (5.8 microns per hour). Plating was interrupted at the end of the workday, the part removed from the bath and then restarted on the next workday.

The full thickness of electroless nickel was not deposited continuously but at various time intervals over a period of several weeks until the Ni—P layer was 0.125 inches (3 mm) thick. After stripping the Enplate No. 1 maskant, any excess Ni—P on the outside diameter edge of the backing plate was readily removed by grinding on a linear belt sander. The trimmed backing plate was then positioned in the vacuum chamber of a Model FA2-4TR sputtering system, developed by Semiconductor Engineering Group, Inc. (SEGI, Milpitas Calif.) as an advanced version of the widely used Perkin-Elmer Type 4400 configuration. The 8 inch diameter copper backing plate is designated as SEGI part number 60-190600-01.

The utility of the electroless-plated Ni—P target of this invention was demonstrated by sputtering a seed layer on aluminum type 5585 alloy memory disk substrates, with dimensions 95 mm o.d., 25 mm i.d., thickness 0.05 inch (1.27 mm). An initial vacuum chamber pressure of $1.4 \times 10$ to the minus 7 torr was increased for sputtering by introducing argon at a pressure of 9 millitorr. A binder layer of chromium was first added by r.f. diode sputtering at a power level of 1 kilowatt for 6 minutes, followed by nickel-phosphorous from the target of the disclosed technology for 11 minutes at a similar power setting. The chromium underlayer thickness was 210 Angstroms, as calculated from the known sputtering rate of 35 Angstroms per kilowatt per minute. Assuming the sputtering rate of Ni—P (12 weight percent phosphorous) is reasonably similar to the known 40 Angstrom per kilowatt per-minute rate for pure nickel, the calculated sputtered Ni—P layer thickness was 440 Angstroms.

The thin layer of Ni—P which was transferred by sputtering from the plated target of this invention onto the aluminum memory disk substrate then successfully acted as a seed layer to nucleate Ni—P deposition from an electroless nickel plating bath—the same Fidelity Type 5023 electroless nickel plating solution used to grow the thick layer of Ni—P on the copper target backing plate. The sputtered Ni—P thin seed layer maintained its catalytic capability and triggered Ni—P plating uniformly over the aluminum disk substrate without additional preparation.

The time interval between dry vacuum sputtering of the Ni—P seed layer and subsequent wet plating of Ni—P ranged from 1 to 24 hours. In related studies, the interval has been extended to at least three months with no diminution of the nucleating power of the sputtered Ni—P surface In general terms, the target Ni—P grown on the copper backing plate by nucleated electroless plating is transferred by sputtering to a new surface on a valuable object where the autocatalytic nucleating capability of the Ni—P continues to function, initiating the electroless deposition of Ni—P on the new surface. The electroplated nickel nucleating layer (Item 8, Table 1) may serve as a one-time starter surface, to be replaced by a sputtered layer of Ni—P for all subsequent target fabrication, provided an uncoated backing plate can be accommodated as a workpiece in the vacuum chamber of a sputter system. A smooth starting target surface is preferable since Ni—P grows conformally. Propagation of a smooth Ni—P deposit provides a smooth target surface ready for use without planarization.

Conformal propagation of a starting surface was noted for the aluminum disk substrates sputtered with Ni—P from the built-up target of this invention. The surface profile of the initial aluminum substrate was essentially unchanged after Ni—P plating, with no new roughness being added by electroless plating. The surface roughness Ra of aluminum disk substrates, the roughness after sputtering a binder layer of chromium plus a seed layer of Ni—P and the roughness after Ni—P plating as catalyzed by the sputtered Ni—P seed layer are shown in Table 2. Ra values are shown for a typical wavelength interval of 15-25 microns as determined by Doppler laser vibrometry (THoT Technologies, Inc. Camp bell Calif.). Plated Ni—P thickness was determined by X-ray fluorescence (FischerScope XUVM).

TABLE 2

Surface Profile
5585 Aluminum Substrate
Sputtered Chromium 210 Angstrom, Sputtered Ni-P 440 Angstrom
Electroless Ni-P Plate

| Part No. | Treatment | Ra Angstrom | Plated Ni—P thickness microinch | (micron) |
|---|---|---|---|---|
| 1 | Cr/Ni—P sputtered; Ni—P plated | 53 | 250 | (6.3) |
| 2 | Cr/Ni—P sputtered; Ni—P plated | 59.5 | 330 | (8.4) |
| 3 | Cr/Ni—P sputtered; Ni—P plated | 58 | 340 | (8.6) |
| 4 | Cr/Ni—P sputtered; Ni—P plated | 52 | 335 | (8.5) |
| 5 | Cr/Ni—P sputtered | 49 | 0 | |
| 6 | Cr/Ni—P sputtered | 55 | 0 | |
| 7 | Cr/Ni—P sputtered | 55 | 0 | |
| 8 | Al substrate | 53.5 | 0 | |
| 9 | Al substrate | 55 | 0 | |
| 10 | Al substrate | 52.5 | 0 | |

Considering the reproducibility of measurement methods, the data in Table 2 indicate there is no significant difference between the average surface roughness of the aluminum substrate, Ra=53.7 Angstroms, and the roughness after plating more than 8 microns of Ni—P, Ra=55.6 Angstroms. For comparison, it is noted that a three-fold increase in roughness as compared with the initial substrate roughness is typical for Ni—P plated on aluminum activated by conventional double zincate wet processing.

The disclosed technology has demonstrated that nucleated electroless plating can grow an adherent thick layer of nickel-phosphorous (Ni—P) alloy which is firmly bonded in direct contact with a copper sputter target backing plate. The disclosed technology affords advantages over powder and casting methods for sputter target fabrication in terms of simplicity of equipment and by providing a means to obtain 100 percent dense targets of Ni—P (and other materials) fully compatible with the vacuum requirements and heat transfer conditions of a sputtering system. While the disclosed technology has been demonstrated with a circular 8 inch diameter target, the method is not limited by dimensions and may be readily applied to other useful target configurations. While the preferred embodiment concerns nickel-phosphorous, the spirit of the disclosed technology applies in a general sense to a novel method for manufacturing sputter targets comprised of various metals and alloys. Both electrolytic deposition and electroless plating may be used to form 100 percent dense targets which are single metals or multi-component alloys. Targets may also be comprised of mixtures of co-deposited particulate metals encapsulated within matrix metals or matrix alloys. Said particulates may be single metals, mixtures of metal powders, powdered alloys or non-metals.

What is claimed is:

1. A method for fabricating metal and metal alloy sputter targets, comprising:
    placing a target backing plate within a solution for electroless deposition, the target backing plate having a target surface and being adapted for installation in a sputter chamber; and
    growing a solid target deposit by electroless deposition on the target surface of the target backing plate in the solution.

2. The method of claim 1, including protecting regions of the target backing plate other than said target surface from said deposition.

3. The method of claim 1, including mounting the target backing plate in a fixture during said electroless deposition, the fixture protecting regions of the target backing plate other than said target surface from said deposition.

4. The method of claim 1, where the target deposit comprises a nickel-phosphorous alloy.

5. The method of claim 1, including forming a layer of pure nickel on the target backing plate to nucleate said electroless deposition.

6. The method of claim 1, including forming a layer of a nickel-phosphorous alloy on the target backing plate to nucleate said electroless deposition.

7. The method of claim 1 including forming a nucleating layer material on the target backing plate to nucleate said electroless deposition, the layer of material having a thickness in a range from about 50 to about 500 Angstroms.

8. The method of claim 1, including forming a nucleating layer material on the target backing plate to nucleate said electroless deposition, said forming including cathodic electrolytic deposition.

9. The method of claim 1, including forming a nucleating layer material on the target backing plate to nucleate said electroless deposition, said forming including sputter deposition alone or in conjunction with an underlayer of binder material.

10. The method of claim 1, including forming a nucleating layer material on the target backing plate to nucleate said electroless deposition, said forming including sputter deposition from a nickel-phosphorous target.

11. The method of claim 1, where the target deposit comprises an alloy of nickel and phosphorous with one or more materials selected from a Group consisting of chromium, cobalt, iron, copper, molybdenum, tungsten, rhenium and tin.

12. The method of claim 1, where the target deposit comprises an alloy of nickel and boron with one or more materials selected from a Group consisting of chromium, cobalt, iron, copper, molybdenum, tungsten, rhenium and tin.

13. The method of claim 1, where the target deposit comprises an alloy of nickel and boron.

14. The method of claim 1, where the target deposit comprises an alloy of nickel and phosphorous and boron.

15. The method of claim 1, where the target deposit comprises an alloy of platinum and rhodium.

16. The method of claim 1, where the target deposit comprises platinum.

17. The method of claim 1, where the target deposit comprises rhodium.

18. The method of claim 1, where the target deposit comprises an alloy of cobalt and phosphorous, with one or more materials selected from a Group consisting of copper, nickel, zinc, iron, rhenium, tungsten and molybdenum.

19. The method of claim 1, where the target deposit comprises an alloy of cobalt and boron, with one or more materials selected from a Group consisting of copper, nickel, zinc, iron, rhenium, tungsten, molybdenum and thallium.

20. A method for fabricating metal and metal alloy sputter targets, comprising:
- placing a target backing plate, the target backing plate having a target surface and adapted for installation in a sputter chamber, within a solution for electroless deposition; and
- growing a solid target deposit by simultaneous electroless deposition of a matrix metal and particulate material on the target surface of the target backing plate in the solution.

21. The method of claim 20, where the electrolessly deposited matrix metal comprises an alloy of nickel and phosphorous.

22. The method of claim 20, where the electrolessly deposited matrix metal comprises an alloy of nickel and boron.

23. The method of claim 20, where the electrolessly deposited matrix metal comprises an alloy of cobalt and phosphorous.

24. The method of claim 20, where the electrolessly deposited matrix metal comprises an alloy of cobalt and boron.

25. The method of claim 20, where the electrolessly deposited matrix metal comprises an alloy mixture of one or more materials selected from a Group consisting of chromium, iron, copper, molybdenum, tungsten, rhenium and tin, codeposited with one of the electrolessly deposited alloys selected from the Group consisting of nickel-phosphorous, nickel-boron, cobalt-phosphorous and cobalt-boron.

26. The method of claim 20, where the electrolessly deposited matrix metal comprises copper.

27. The method of claim 20, where the particulate material has an average particle size in a range from 0.1 to 100 microns.

28. The method of claim 20, where the particulate material has an average particle size in a range from 0.1 to 10 microns.

29. The method of claim 20, where the particulate material comprises one or more materials selected from a Group consisting of chromium, molybdenum, tungsten, boron, titanium, vanadium, zirconium, hafnium, niobium, and tantalum.

30. The method of claim 20, where the particulate material comprises a pre-alloyed mixture of metals.

31. The method of claim 20, where the particulate material comprises an alloy comprised mainly of iron and chromium and nickel and is generally designated as stainless steel.

32. The method of claim 20, where the particulate material comprises an alloy comprised mainly of chromium and cobalt and is generally designated as Haynes stellite.

33. The method of claim 20, where the particulate material comprises a multiplicity of pre-alloyed powders.

34. The method of claim 20, where the particulate material comprises a non-metal.

35. The method of claim 20, where the particulate material comprises a compound.

36. The method of claim 20, where the particulate material comprises one or more materials selected from a Group consisting of diamond, silicon, silicon carbide, and aluminum oxide.

* * * * *